(12) United States Patent
Kitamoto

(10) Patent No.: US 8,786,228 B2
(45) Date of Patent: Jul. 22, 2014

(54) CONTROLLER FOR ELECTRICAL POWER STEERING APPARATUS

(75) Inventor: Hiroshi Kitamoto, Toyota (JP)

(73) Assignee: JTEKT Corporation, Osaka-Shi (JP)

( * ) Notice: Subject to any disclaimer, the term of this patent is extended or adjusted under 35 U.S.C. 154(b) by 45 days.

(21) Appl. No.: 13/398,140

(22) Filed: Feb. 16, 2012

(65) Prior Publication Data

US 2012/0212159 A1 Aug. 23, 2012

(30) Foreign Application Priority Data

Feb. 23, 2011 (JP) ................. 2011-036764
Mar. 25, 2011 (JP) ................. 2011-066925

(51) Int. Cl.
*H02H 7/08* (2006.01)
*H02P 1/00* (2006.01)

(52) U.S. Cl.
USPC ............... 318/400.21; 318/139; 318/430

(58) Field of Classification Search
None
See application file for complete search history.

(56) References Cited

U.S. PATENT DOCUMENTS

2010/0263960 A1* 10/2010 Nagase ............... 180/443
2011/0205672 A1 8/2011 Sakai

FOREIGN PATENT DOCUMENTS

| EP | 2 182 629 A2 | 5/2010 |
|----|---|---|
| EP | 2 226 237 A1 | 9/2010 |
| JP | A-2008-141612 | 6/2008 |
| JP | A-2010-252470 | 11/2010 |
| WO | WO 2010/032705 A1 | 3/2010 |

OTHER PUBLICATIONS

Aug. 28, 2012 Extended Search Report issued in European Patent Application No. 12156120.3.

* cited by examiner

*Primary Examiner* — Paul Ip
*Assistant Examiner* — Devon Joseph
(74) *Attorney, Agent, or Firm* — Oliff PLC

(57) ABSTRACT

The electrical power steering apparatus 10 includes the $1^{st}$ MOS-FET 13 and the $2^{nd}$ MOS-FET 14 accommodating the $1^{st}$ parasitic diode 15 and the $2^{nd}$ parasitic diode 16 in the conducting path between the battery 100 and the motor driving circuit 11 and being connected in series at the opposite direction respectively, and the condenser 18 in an output side of the latter $2^{nd}$ MOS-FET 14. The ECU 6 of the controller of the electrical power steering apparatus controls to turn on or off the $1^{st}$ MOS-FET 13 and the $2^{nd}$ MOS-FET 14 in accordance with the predetermined sequence after the ignition switch 17 is turned on, detecting the fault of the $1^{st}$ MOS-FET 13, the $2^{nd}$ MOS-FET 14 and the $1^{st}$ parasitic diode 15 and the $2^{nd}$ parasitic diode 16 on the basis of the output voltage from each of the $1^{st}$ MOS-FET 13 and the $2^{nd}$ MOS-FET 14.

2 Claims, 3 Drawing Sheets

CONTROLLER FOR ELECTRICAL POWER STEERING APPARATUS

INCORPORATION BY REFERENCE

The present application claims priority under 35 U.S.C. §119 to Japanese Patent Application No. 2011-066925, filed on Mar. 25, 2011 claiming the benefit of Japanese Patent Application No. 2011-036764, filed on Feb. 23, 2011. The content of this application is incorporated herein by reference in the entirety.

BACKGROUND OF THE INVENTION

1. Field of the Invention

The present invention relates to a controller for an electrical power steering apparatus.

2. Description of the Related Art

It is well known in the prior art of a motor driving apparatus in which a switching element of a MOS-FET is mounted in a conducting path between a battery and a motor driving circuit to drive a motor by controlling the conduct to the motor by the way of turning on or off the MOS-FET in accordance with various causes. The motor driving apparatus is popular for a controlling circuit of the various kinds of the motor.

There happens an on-fault or a off-fault of the MOS-FET as the switching element on a basis of various causes in the prior art. Because of that, the previous apparatus detects the fault of the MOS-FET as a short fault or an open fault by judging whether the MOS-FET is in an ON stage or not as disclosed in the Japanese Patent Tokkai 2008-141612.

In general, a controller for a power steering as a prior art includes a MOS-FET as a switching element to turn on or off the conduct of the power. However, a parasitic diode is mounted at a reversed direction between a drain and a source of the MOS-FET, for example so that the current is flown in a direction from the drain to the source at a N-channel MOS-FET. According to this construction, the fault of the MOS-FET can not be detected because the current is flowing to continue its operation where the parasitic diode is on as a normal.

SUMMARY OF THE INVENTION

In view of the previously mentioned circumstances, it is an object of the present invention to provide a controller for a power steering apparatus judging a fault of a parasitic diode and detecting a fault of a power relay when the MOS-FET is mounted for the power relay.

In order to achieve the above and other objects, one aspect of the present invention provides a controller for a power steering apparatus including a motor supplying a steering assist force to said power steering apparatus for a vehicle, a motor driving member outputting a driving power to the motor, a battery supplying power voltage to the motor driving member, an ignition switch turning on or off the battery, a switching member mounted in a conducting path from the battery to the motor driving member, and a condenser mounted at an input side of the motor driving member, the switching member has two switching elements to turn on or off the conducting path by turning on or off according to a driving signal being input into a gate, and parasitic diodes mounted in parallel between a drain and a source of the switching elements, the switching elements are connected in series at the opposite direction respectively on the conducting path and are connected to the ignition switch, wherein the controller comprises a voltage detecting member detecting output voltage from each of the switching elements; and a fault judging member judging faults of each of the switching elements and the parasitic diodes in accordance with each of the output voltages detected by the voltage detecting member.

In the present invention, two switching members including parasitic diodes are connected in series at the opposite direction, and the condenser is mounted at the output side of the latter switching member. It detects the faults of the switching elements and the parasitic diodes in accordance with each of the output voltages detected by the voltage detecting member. As a result, it can detect the fault of the switching element firmly and judge the fault of the parasitic diode that can not be judged by the prior controller.

BRIEF DESCRIPTION OF THE DRAWINGS

Various other objects, features and many of the attendant advantages of the present invention will be readily appreciated as the same becomes better understood by reference to the following detailed description of the preferred embodiments when considered in connection with the accompanying drawings, in which.

DETAILED DESCRIPTION OF THE PREFERRED EMBODIMENTS

Figure 1:
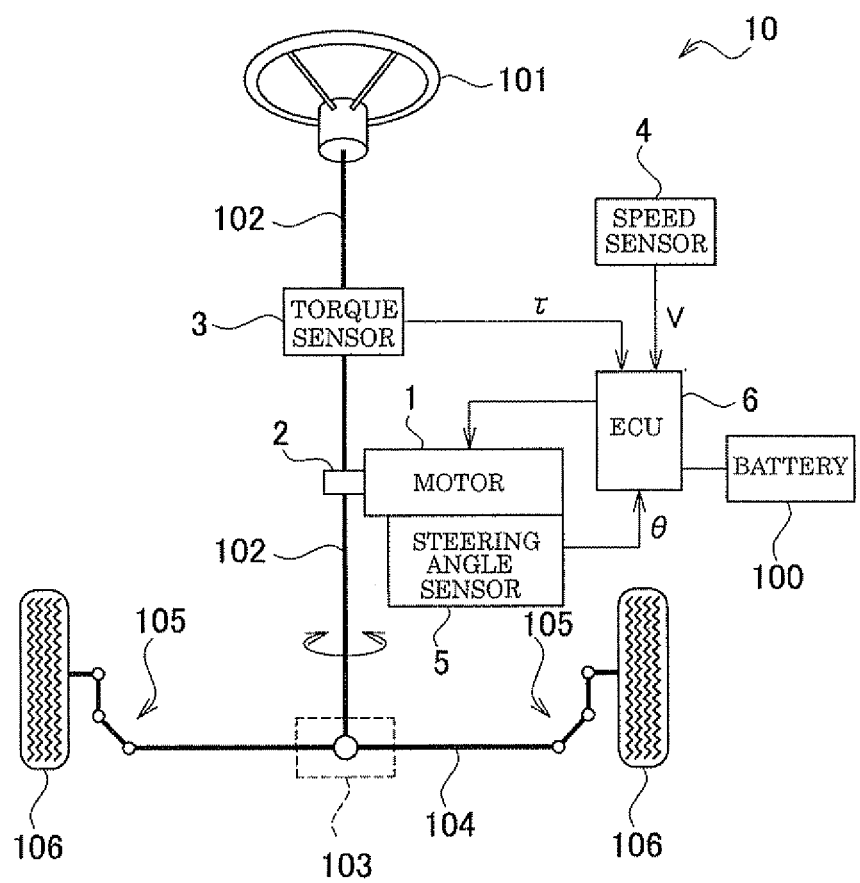
FIG. 1 is a schematic diagram of an electrical power steering apparatus.

A preferred embodiment of a controller for an electrical power steering apparatus according to the present invention will be described in referring to FIG. 1 to FIG. 3. FIG. 1 shows constructions relating to one embodiment of the controller for the electrical power steering apparatus in addition to other constructions of a vehicle therefor.

An electrical power steering apparatus 10 shown in FIG. 1 is a column assisted type electrical power steering apparatus including a motor 1, a reduction gear 2, a torque sensor 3, a speed sensor 4, a steering angle sensor 5 and a controller 6 (hereinafter referred as an ECU 6).

A steering wheel 101 connected to one end of a steering shaft 102 as shown in FIG. 1, a rack shaft 104 is connected with the other end of the steering shaft 102 through a rack and pinion mechanism 103. Each of both ends of rack shaft 104 is respectively connected with steered wheels 106 through a connecting member 105 having tie rods and knuckle arms. The steering shaft 102 is rotated to reciprocate the rack shaft 104 when a driver steers the steering wheel 101. A turning direction of the steered wheels 106 is changed in accordance with the reciprocating movement of the rack shaft 104.

The electrical power steering apparatus 10 assists steering operation explained hereinafter in order to reduce load to the driver. The torque sensor 3 detects steering torque acting to the steering shaft 102 by operation of the steering wheel 101. The speed sensor 4 detects vehicle speed V. The steering angle sensor 5 detects a rotational position of a rotor of the motor 1 (hereinafter referred as motor rotational angle θ of the motor). The steering angle sensor 5 is constructed with, for example, a resolver.

The ECU 6 receives power from a battery 100 to drive the motor 1 in accordance with the steering torque τ, the vehicle speed V and the motor rotational angle θ of the motor. The motor 1 is driven by the ECU 6 to generate steering assist force. The reduction gear 2 is located between the motor 1 and the steering shaft 102. The steering assist torque (hereinafter referred as assist force) generated by the motor 1 acts to rotate the steering shaft 102.

As a result, the steering shaft 102 is rotated by both of the steering torque τ and the assist force generated by the motor 1. The electrical power steering apparatus 10 acts as the steering assist by giving the assist force generated by the motor 1 to the steering mechanism of the vehicle.

Figure 2:
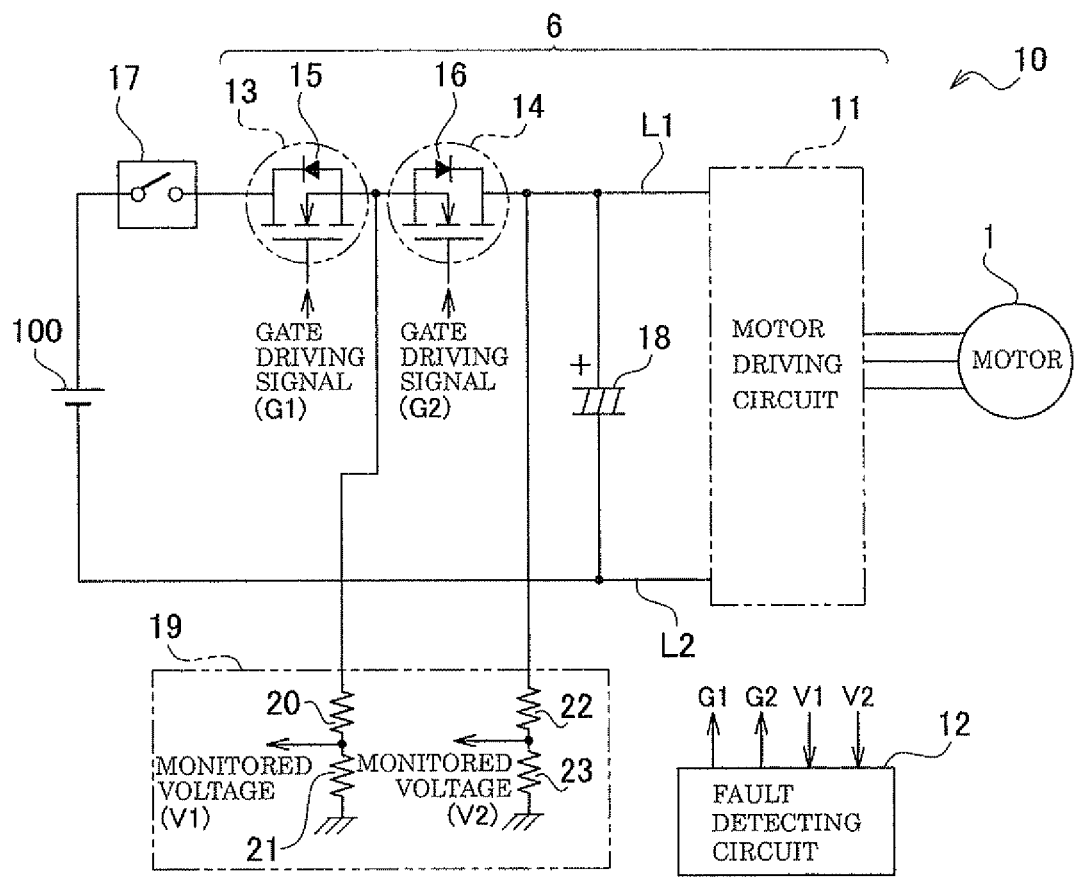
FIG. 2 is a circuit diagram of a controller for the electrical power steering apparatus.

FIG. 2 shows a circuit diagram of a control circuit included in the power steering apparatus 10. The control circuit shown in FIG. 2 includes power relays 13, 14, a condenser 18 and a motor driving circuit 11 (identified as "motor driving member" in the present invention). A power relay (identified as "switching member") is for example a MOS-FET includes each of switching elements and each of $1^{st}$ and $2^{nd}$ parasitic diodes 15, 16. The control circuit is mounted in the ECU 6 to be connected to the battery 100 through an ignition switch 17 (hereinafter referred as IG switch). Each of the $1^{st}$ MOS-FET 13 and the $2^{nd}$ MOS-FET 14 are connected in the conducting path between the battery 100 and the motor driving circuit 11 in series at the opposite direction respectively as shown in FIG. 2. In the ECU 6 is equipped a fault detecting circuit 12 (identified as "fault judging member") controlling to turn on or off the $1^{st}$ MOS-FET 13 and the $2^{nd}$ MOS-FET 14 and judging any fault in the $1^{st}$ MOS-FET 13 and the $2^{nd}$ MOS-FET 14. To the fault detecting circuit 12 is connected a power monitoring circuit 19 (identified as "voltage detecting member") detecting each output voltage from the $1^{st}$ MOS-FET 13 and the $2^{nd}$ MOS-FET 14.

Each of the $1^{st}$ MOS-FET 13 and the $2^{nd}$ MOS-FET 14 in FIG. 2 is a power switch switching in an on-stage or an off-stage to connect or disconnect the condenser 18 and the motor driving circuit 11 to the battery 100. The $1^{st}$ MOS-FET 13 is prepared for a circuit breaker connecting or disconnecting the power from the battery 100 in normal. The $2^{nd}$ MOS-FET 14 is prepared for a circuit protector disconnecting the power from the battery 100 when the battery 100 is connected in reverse as abnormal since the $2^{nd}$ MOS-FET 14 is connected in series at the opposite direction with the $1^{st}$ MOS-FET 15. The $1^{st}$ MOS-FET 13 and the $2^{nd}$ MOS-FET 14 is in the on-stage at an operation status of the electrical power steering apparatus 10 and in the off-stage at a stopping status of the electrical power steering apparatus 10.

Between drain and source terminals of two $1^{st}$ MOS-FET 13, $2^{nd}$ MOS-FET 14 are mounted $1^{st}$ parasitic diode 15 and $2^{nd}$ parasitic diode 16 allowing currents to be flowed from the drain terminal to the source terminal.

The motor driving circuit 11 is a well-known inverter consisting of three arm circuits connected in parallel respectively, each of which consists of two un-illustrated MOS-FET connected in series respectively. The motor driving circuit 11 consisting of six MOS-FETs as a switching element is inserted between two power lines L1, L2. The motor 1 is a three-phase blushless motor having a three-phase wire.

A fault detecting circuit 12 mounted in the ECU 6 controls two $1^{st}$ MOS-FET 13 and $2^{nd}$ MOS-FET 14 included in the control circuit. The fault detecting circuit 12 includes an un-illustrated micro computer (hereinafter referred as a CPU) outputting a control signal to turn on or off the $1^{st}$ MOS-FET 13 and the $2^{nd}$ MOS-FET 14, and an un-illustrated pre-driver generating a driving signal on a basis of these control signals. The fault detecting circuit 12 outputs gate driving signals G1, G2 turning on or off the $1^{st}$ MOS-FET 13 and the $2^{nd}$ MOS-FET 14 and each of these gate driving signals G1, G2 is input into a gate terminal of each of the MOS-FETs.

To the fault detecting circuit 12 are input both of an output from the $1^{st}$ MOS-FET 13 as a monitored voltage V1 divided by resistances 20, 21 in a power monitoring circuit 19 and of an output from the $2^{nd}$ MOS-FET 14 as a monitored voltage V2 divided by resistances 22, 23 in the power monitoring circuit 19 in accordance with the on and off stages of the $1^{st}$ MOS-FET 13 and the $2^{nd}$ MOS-FET 14. The monitored voltages V1, V2 being input into the fault detecting circuit 12 are respectively used for calculating process by the CPU mounted in the ECU 6 after being transformed by an A/D converter.

The condenser 18 is mounted between two power lines L1 and L2 at an input side of the motor driving circuit 11. The condenser 18 accumulates charges from the battery 100 through an IG switch 17, the $1^{st}$ MOS-FET 13 and the $2^{nd}$ MOS-FET 14 and discharges the accumulated charges when amount of current flowing from the battery 100 to the motor driving circuit 11 is insufficient. Therefore, the condenser 18 acts as a condenser for absorbing current ripple.

It will be explained hereinafter a process of the fault detecting by the $1^{st}$ MOS-FET 13, the $2^{nd}$ MOS-FET 14 and the $1^{st}$ parasitic diode 15, the $2^{nd}$ parasitic diode 16 included in the control circuit.

Figure 3:
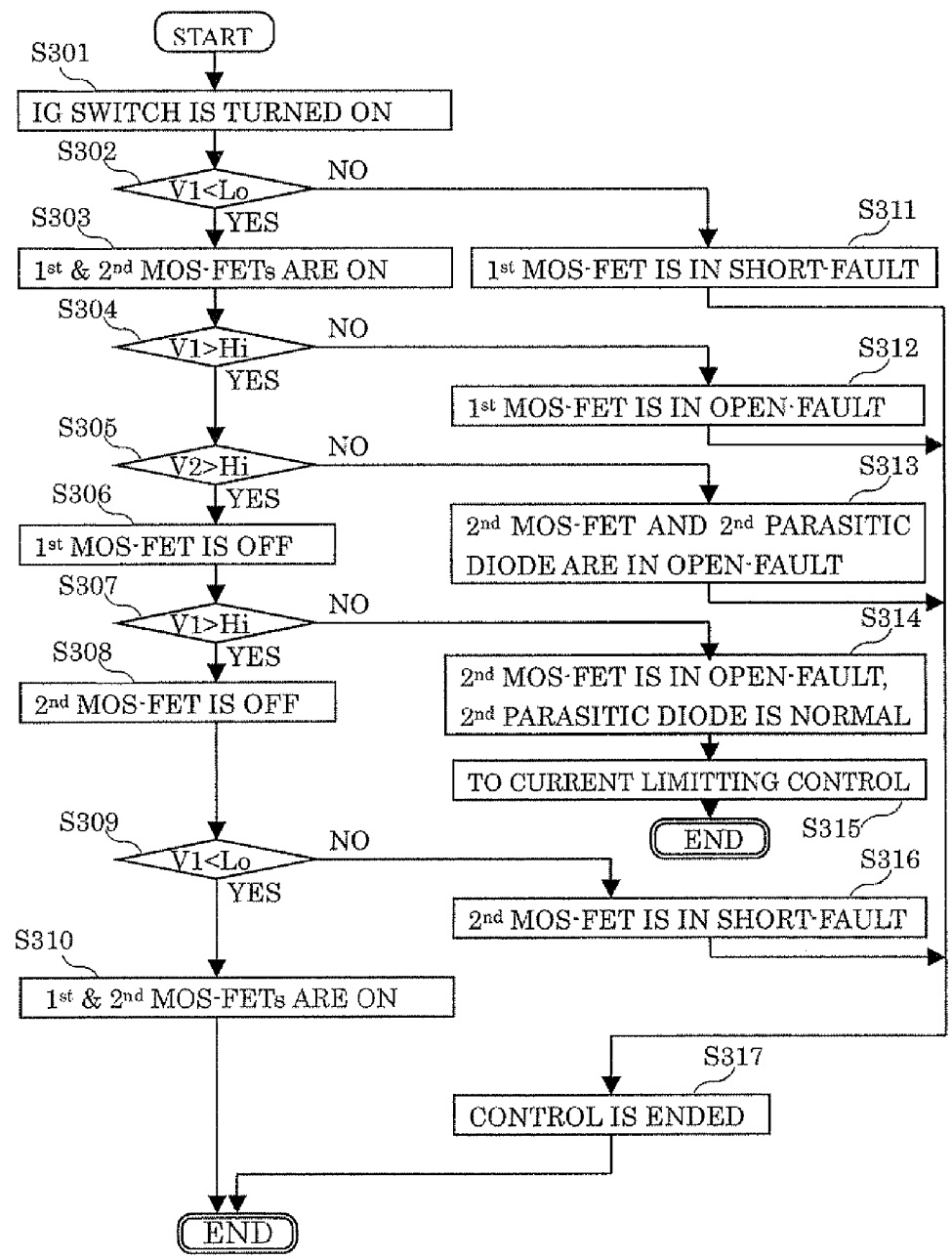
FIG. 3 is a flow chart showing a operation sequence of a fault detecting of a MOS-FET accommodating in the controller for the electrical power steering apparatus.

The fault detecting circuit 12 in one embodiment of the present invention executes each process in Steps S301 to S317 shown in a flow chart of FIG. 3.

The fault detecting circuit 12 executes calculating process by a computer program that is operated by the CPU installed in the ECU 6 as shown in FIG. 2. The CPU executes the ON/OFF control and the fault detecting of the $1^{st}$ MOS-FET 13 and the $2^{nd}$ MOS-FET 14 by detecting the above-identified amount of each stage in every predetermined sampling period and by executing each of next calculating processes predetermined periodically.

FIG. 3 shows a flow of the operation by the ECU 6. As shown in FIG. 3, the fault detecting circuit 12 judges whether the amount of the monitored voltage V1 of the output voltage from the $1^{st}$ MOS-FET 13 is under the predetermined reference value or not in Step S302 when the ignition (IG) switch 17 shown in FIG. 2 is turned on in Step S301. At this moment, the $1^{st}$ MOS-FET 13 and the $2^{nd}$ MOS-FET 14 are turned off because the gate driving signals G1, G2 are turned off.

In this moment, where the amount of the monitored voltage V1 is over the predetermined reference value in NO at the Step S302, in other words the amount is in a high level showing the status that the $1^{st}$ MOS-FET 13 is abnormally connected by a short, it is judged in a fault of a short-circuit at the $1^{st}$ MOS-FET 13 in Step S311 to turn off the gate driving signals G1, G2, thereby the control by ECU 6 is ended in Step S317.

Where the amount of the monitored voltage V1 is under the predetermined reference value in YES at the Step S302, in other words the amount is in a low level, it is controlled to turn on both of the $1^{st}$ MOS-FET 13 and the $2^{nd}$ MOS-FET 14 by turning on the gate driving signals G1, G2 in Step S303.

In next Step S304 it is judged whether the amount of the monitored voltage V1 of the $1^{st}$ MOS-FET 13 is over a predetermined reference value or not. Where the amount of the monitored voltage V1 is under the last mentioned predetermined reference value Hi in NO at the Step S304, in other words the amount is in a low level showing the status that the $1^{st}$ MOS-FET 13 is abnormally unconnected by a open, it is judged in a fault of an open-circuit at the $1^{st}$ MOS-FET 13 in Step S312 to turn off the gate driving signals G1, G2, thereby the control by ECU 6 is ended in Step S317. Where the amount of the monitored voltage V1 is over the predetermined reference value in YES at the Step S304, in other words the amount is in the high level, it is shifted to Step S305.

In next Step S305 it is judged whether the amount of the monitored voltage V2 of the $2^{nd}$ MOS-FET 14 is over the predetermined reference value or not, same value to the predetermined reference value in Step S304. Where the amount of the monitored voltage V2 is under the predetermined reference value in NO at the Step S305, it is judged in a fault of an open-circuit at the $2^{nd}$ MOS-FET 14 and a fault of an open-circuit at the $2^{nd}$ parasitic diode 16 of the $2^{nd}$ MOS-FET 14 in Step S313 to turn off the gate driving signals G1, G2, thereby the control by ECU 6 is ended in Step S317.

Where the amount of the monitored voltage V2 is over the predetermined reference value in YES at the Step S305, in other words the amount is in the high level, it is controlled to turn off the $1^{st}$ MOS-FET 13 by turning off the gate driving signal G1 in Step S306.

In next Step S307 it is judged whether the amount of the monitored voltage V1 of the $1^{st}$ MOS-FET 13 is over the predetermined reference value or not. Where the amount of the monitored voltage V1 is under the predetermined reference value in NO at the Step S305, in other words in the low level, it is judged in a fault of an open-circuit at the $2^{nd}$ MOS-FET 14 and in a normal of a continuity state of the $2^{nd}$ parasitic diode 16 of the $2^{nd}$ MOS-FET 14 in Step S314, so that the ECU 6 changes to a current limiting control to limit the motor driving current under an allowable current value of the $2^{nd}$ parasitic diode 16 in the $2^{nd}$ MOS-FET 14 and continues its operation in Step S315.

Where the amount of the monitored voltage V1 is over the predetermined reference value in YES at the Step S307, in other words in the high level, it is controlled to turn off the $2^{nd}$ MOS-FET 14 by turning off the gate driving signal G2 in Step S308.

In next Step S309 it is judged whether the amount of the monitored voltage V1 of the $1^{st}$ MOS-FET 13 is under the predetermined reference value or not, same value to the predetermined reference value in Step S302. Where the amount of the monitored voltage V1 is over the predetermined reference value in NO at the Step S309, in other words in the high level, it is judged in a fault of an short-circuit at the $2^{nd}$ MOS-FET 14 in Step S316, thereby the ECU 6 turns off the gate driving signals G1, G2 to end its control in Step S317.

Where the amount of the monitored voltage V1 is under the predetermined reference value in YES at the Step S309, in other words in the low level, it is judged in a normal of the $1^{st}$ MOS-FET 13 and the $2^{nd}$ element 14 to turn on the gate driving signals G1, G2, thereby continuing the operation turning on both of the $1^{st}$ MOS-FET 13 and the $2^{nd}$ MOS-FET 14 in Step S310 as the normal.

The one embodiment of the electrical power steering apparatus 10 includes the $1^{st}$ MOS-FET 13 and the $2^{nd}$ MOS-FET 14 accommodating the $1^{st}$ parasitic diode 15 and the $2^{nd}$ parasitic diode 16 in the conducting path between the battery 100 and the motor driving circuit 11 and being connected in series at the opposite direction respectively, and the condenser 18 in an output side of the latter $2^{nd}$ MOS-FET 14. The ECU 6 of the controller of the electrical power steering apparatus controls to turn on or off the $1^{st}$ MOS-FET 13 and the $2^{nd}$ MOS-FET 14 in accordance with the predetermined sequence by turning on or off the gate driving signals G1, G2 to detect the fault of the $1^{st}$ MOS-FET 13, the $2^{nd}$ MOS-FET 14 and the $1^{st}$ parasitic diode 15 and the $2^{nd}$ parasitic diode 16 on the basis of the output voltage from each of the $1^{st}$ MOS-FET 13 and the $2^{nd}$ MOS-FET 14. It is therefore for the controller of the electrical power steering apparatus to be able to detect the fault of the MOS-FETs certainly and to judge the fault of the parasitic diode.

Where it is detected the fault of the $2^{nd}$ MOS-FET 14 but the normal of the $2^{nd}$ parasitic diode 6 only, the ECU 6 controls to limit the motor driving current so that the current of the source is under the allowable current for the parasitic diode. The ECU 6 can thereby maintain to control and prevent from making the $2^{nd}$ parasitic diode 16 overheat or fail based on continuing to flow the large current.

The controller for the electrical power steering apparatus can achieve next effects.

In the embodiment of the present invention it connects two MOS-FETs in series at the opposite direction as the relay for the power, turns on or off each of two MOS-FETs in accordance with the predetermined sequence, detects the output voltage from each of two MOS-FETs and judges the short or open fault of the MOS-FETs, thereby it can judge the fault of the parasitic diode that can not be judged by the prior controller.

As a result, even when the latter MOS-FET is braked down in open-fault, the normal of its parasitic diode can continue to flow the current in the current limiting control, therefore it can prevent the burning of the MOS-FET made by the over heat of the parasitic diode.

The controller of the prior art needs additional circuit accumulating a charge in another condenser to detect the short-fault or the open-fault of the MOS-FET consisting of the power relay, however the present invention does not need any additional detecting circuit by executing to detect the short-fault or the open-fault of the MOS-FET in the predetermined sequence.

While the invention has been described in detail with reference to the preferred embodiment, it will be apparent to those skilled in the art that the invention is not limited to the present embodiment, and that the invention may be realized in various other embodiments within the scope of the claims.

For example, while the invention is applied for the electrical power steering apparatus, however it may be applicable for another apparatus.

While the invention is applied for the column assisted electrical power steering apparatus, however it may be applicable for a pinion assisted electrical power steering apparatus or a rack assisted electrical power steering apparatus.

What is claimed is:

1. A controller for a power steering apparatus comprising:
   a motor supplying a steering assist force to said power steering apparatus for a vehicle;
   a motor driving member outputting a driving power to said motor;
   a battery supplying power voltage to said motor driving member;
   an ignition switch turning on or off said battery;
   a switching member mounted in a conducting path from said battery to said motor driving member; and
   a condenser mounted at an input side of said motor driving member;
   said switching member has two switching elements to turn on or off said conducting path by turning on or off according to a driving signal being input into a gate, and parasitic diodes mounted in parallel between a drain and a source of said switching elements, said switching elements are connected in series at the opposite direction respectively on said conducting path and are connected to said ignition switch;
   a voltage detecting member detecting output voltage from each of said switching elements; and a fault judging member judging faults of each of said switching elements and said parasitic diodes in accordance with each of said output voltages detected by said voltage detecting member.

2. The controller for a power steering apparatus according to claim 1, wherein said switching member turns on or off said switching elements in a predetermined sequence after said ignition switch is turned on.

* * * * *